(12) United States Patent
Nakamura et al.

(10) Patent No.: US 8,830,010 B2
(45) Date of Patent: Sep. 9, 2014

(54) HIGH FREQUENCY CIRCUIT MODULE WITH A FILTER IN A CORE LAYER OF A CIRCUIT SUBSTRATE

(71) Applicant: Taiyo Yuden Co., Ltd., Tokyo (JP)

(72) Inventors: Hiroshi Nakamura, Tokyo (JP); Tomohiro Igarashi, Tokyo (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 14/077,697

(22) Filed: Nov. 12, 2013

(65) Prior Publication Data

US 2014/0133103 A1 May 15, 2014

(30) Foreign Application Priority Data

Nov. 13, 2012 (JP) ................. 2012-249160

(51) Int. Cl.
| | |
|---|---|
| *H03H 7/46* | (2006.01) |
| *H03H 9/70* | (2006.01) |
| *H05K 7/20* | (2006.01) |
| *H04B 1/50* | (2006.01) |
| *H05K 1/02* | (2006.01) |
| *H05K 1/18* | (2006.01) |
| *H03H 9/08* | (2006.01) |
| *H03H 9/05* | (2006.01) |
| *H01L 23/373* | (2006.01) |

(52) U.S. Cl.
CPC .............. *H05K 1/0237* (2013.01); *H05K 1/185* (2013.01); *H05K 1/0207* (2013.01); *H05K 1/0206* (2013.01); *H03H 9/08* (2013.01); *H03H 7/463* (2013.01); *H03H 9/0566* (2013.01); *H01L 23/3735* (2013.01)
USPC ........... 333/132; 333/133; 333/126; 333/129; 370/278; 370/282; 361/704; 361/707; 361/712; 455/78; 455/82; 455/83

(58) Field of Classification Search
CPC ......... H03H 7/46; H03H 7/461; H03H 7/463; H03H 9/0538; H03H 9/0542; H03H 9/0547; H03H 9/0552; H03H 9/0557; H03H 9/0561; H03H 9/0566; H03H 9/0571; H03H 9/0576; H03H 9/08; H01L 23/3735; H05K 1/0206; H05K 1/0207; H05K 1/185; H05K 1/0237
USPC .......... 333/110, 126, 129, 132–135; 370/276, 370/278, 282; 330/307; 361/704, 707, 361/709–712, 715–722, 736, 737, 748, 761, 361/764, 782, 783; 455/78, 82, 83
See application file for complete search history.

(56) References Cited

U.S. PATENT DOCUMENTS

| | | | |
|---|---|---|---|
| 6,501,945 B1 | 12/2002 | Chien | |
| 6,818,979 B2 * | 11/2004 | Takehara et al. | ............... 257/687 |

(Continued)

FOREIGN PATENT DOCUMENTS

| | | | |
|---|---|---|---|
| JP | 2005-198051 A | | 7/2005 |
| JP | 2006-073673 | * | 3/2006 |

(Continued)

OTHER PUBLICATIONS

Japanese Office Action dated on Sep. 25, 2013, in a counterpart Japanese patent application No. 2013-179365.

(Continued)

*Primary Examiner* — Barbara Summons
(74) *Attorney, Agent, or Firm* — Chen Yoshimura LLP

(57) ABSTRACT

The high frequency circuit module includes an RFIC configured to transmit and receive a high frequency signal, a power amplifier IC configured to amplify a transmission signal outputted from the RFIC, and a duplexers configured to separate the transmission signal outputted from the power amplifier IC and inputted to an antenna and a reception signal from the antenna and inputted to the RFIC from each other, in which at least one of the RFIC and power amplifier IC is embedded in the circuit substrate, and the duplexers are disposed between the RFIC and the power amplifier IC.

2 Claims, 4 Drawing Sheets

(56) References Cited

U.S. PATENT DOCUMENTS

| | | | |
|---|---|---|---|
| 6,873,529 B2* | 3/2005 | Ikuta et al. | 361/719 |
| 6,879,488 B2* | 4/2005 | Takeda et al. | 361/704 |
| 7,289,008 B2* | 10/2007 | Kuroki et al. | 333/133 |
| 8,483,104 B1* | 7/2013 | Saji et al. | 370/276 |
| 8,536,957 B1* | 9/2013 | Nakamura et al. | 333/132 |
| 2004/0067771 A1* | 4/2004 | Wieck | 455/558 |
| 2005/0104685 A1 | 5/2005 | Kuroki et al. | |
| 2005/0151599 A1 | 7/2005 | Ido et al. | |
| 2006/0068748 A1 | 3/2006 | Irie et al. | |
| 2006/0276158 A1 | 12/2006 | Okabe | |
| 2008/0174684 A1* | 7/2008 | Narita | 348/294 |
| 2008/0212552 A1 | 9/2008 | Fukamachi et al. | |
| 2009/0116510 A1 | 5/2009 | Georgantas et al. | |
| 2011/0304388 A1 | 12/2011 | Yamawaki et al. | |
| 2013/0043584 A1* | 2/2013 | Kwon et al. | 257/737 |
| 2013/0163212 A1* | 6/2013 | Tanaka et al. | 361/748 |
| 2014/0055956 A1* | 2/2014 | Nakamura et al. | 361/712 |
| 2014/0056183 A1 | 2/2014 | Nakamura et al. | |

FOREIGN PATENT DOCUMENTS

| | | | |
|---|---|---|---|
| JP | 2006-121147 | * | 5/2006 |
| JP | 2006-180336 A | | 7/2006 |
| JP | 2006-203652 A | | 8/2006 |
| JP | 2006-340257 A | | 12/2006 |
| JP | 2008-72738 A | | 3/2008 |
| JP | 2010-161801 A | | 7/2010 |
| JP | 2011-187831 A | | 9/2011 |

OTHER PUBLICATIONS

Japanese Office Action dated on Nov. 20, 2013, in a counterpart Japanese patent application No. 2013-179365.

Japanese Office Action dated on Sep. 25, 2013, in a counterpart Japanese patent application No. 2013-179357.

Okabe et al., "Compact Radio System Module for Triple-band GSM Cellular Phones", 2005 IEEE Radio Frequency Integrated Circuits (RFIC) Symposium, Jun. 12-14, 2005, pp. 273-276. (Cited in the related Patent No. 8,536,957 and U.S. Appl. No. 13/963,775.).

Park et al., "Thermal Analysis of Fully Integrated RF Single-Package Module for GSM Quad Band Handsets", Proceedings of the 6th International Conference on Thermal, Mechanical and Multiphysics Simulation and Experiments in Micro-Electronics and Micro-Systems, EuroSimE 2005, Apr. 18-20, 2005, pp. 670-674. (Cited in the related Patent No. 8,536,957 and U.S. Appl. No. 13/963,775.).

U.S. Appl. No. 13/963,775, filed Aug. 9, 2013.

* cited by examiner

HIGH FREQUENCY CIRCUIT MODULE WITH A FILTER IN A CORE LAYER OF A CIRCUIT SUBSTRATE

This application claims the benefit of Japanese Application No. 2012-249160, filed in Japan on Nov. 13, 2012, which is hereby incorporated by reference in its entirety.

BACKGROUND OF THE INVENTION

1. Field of the Invention

The present invention relates to a high frequency circuit module in which a high frequency integrated circuit (IC), a power amplifier IC, and a duplexer are mounted on a circuit substrate, and more particularly, to an arrangement of components of a high frequency circuit module.

2. Description of Related Art

Recently, multi-functional mobile phones having a small size, so-called smart phones, are being developed. In such mobile phones, a high frequency circuit module with a circuit substrate having thereon various components for transmitting and receiving a high frequency signal is mounted on a mother board (for example, see Patent Document 1). In a high frequency circuit module disclosed in Patent Document 1, a high frequency integrated circuit (IC) configured to transmit and receive a high frequency signal, a power amplifier IC configured to amplify a transmission signal, a transmission filter, a reception filter, a high frequency switch, and the like are mounted on a circuit substrate. An output signal of the power amplifier IC passes through, in sequence, a transmission matching circuit, the transmission filter and the high frequency switch, and is then outputted through an antenna. A reception signal received through the antenna passes through, in sequence, the high frequency switch, the reception filter and a receiving matching circuit and is then inputted to the high frequency IC. Here, a signal wire for transmitting the transmission signal from the high frequency IC to the high frequency switch and a signal wire for transmitting the reception signal from the high frequency switch to the high frequency IC are disposed on the circuit substrate in a manner that these signal wires do not intersect with each other and are not adjacent to each other. Patent Document 2 discloses a multi-mode high frequency circuit in which a GSM-based circuit system unrelated to an operation of W-CDMA circuit system is disposed along a shortest path between the circuit system configured to handle a W-CDMA RF transmission signal and a receiving circuit configured to handle a W-CDMA RF reception signal capable of reducing signal interference between a W-CDMA transmission circuit and a W-CDMA receiving circuit.

RELATED ART DOCUMENTS

Patent Documents

Patent Document 1: Japanese Patent Application Laid-Open Publication No. 2005-198051
Patent Document 2: Japanese Patent Application Laid-Open Publication No. 2006-340257

SUMMARY OF THE INVENTION

However, conventional technology is not capable of properly meeting latest demands for smaller and more highly integrated mobile phones. In the high frequency circuit module disclosed in Patent Document 1, the power amplifier IC is disposed immediately adjacent to the high frequency IC such that a signal wire for a reception signal passes through the vicinity of the power amplifier IC due to miniaturization and high density. Thus, noise or a leakage signal generated by the power amplifier IC is likely to enter into a receiving circuit of the high frequency IC. In the block for W-CDMA of a first communication technique disclosed in Patent Document 2, a duplexer 100 is distant from the high frequency IC 310 although a W-PA-IC 121 corresponding to the power amplifier IC is spaced apart from a high frequency IC 310. Thus, noise or a leakage signal generated by the power amplifier IC is mixed with a reception signal passing through the duplexer 100 in the receiving circuit of the high frequency IC.

The present invention is made in view of the above-mentioned situation, and an object thereof is to provide a high frequency circuit module having a high installation density.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, a high frequency circuit module according to the present invention includes: a circuit substrate having alternately stacked insulating layers and conductive layers; a high frequency IC that is mounted on the circuit substrate and that performs transmission and reception of a high frequency signal; a power amplifier IC that is mounted on the circuit substrate and that amplifies a transmission signal from the high frequency IC; and a duplexer that separates the transmission signal outputted from the power amplifier IC to the antenna from a reception signal inputted from the antenna to the high frequency IC, wherein either one or both of the high frequency IC and the power amp IC is embedded in the circuit substrate and the duplexer is disposed between the high frequency IC and the power amp IC when viewing through the circuit substrate from the top.

According to the present invention, a signal wire for inputting the reception signal from the duplexer to the high frequency IC need not be disposed near the power amplifier IC, and can be shortened. Such structure facilitates the miniaturization and high density while preventing noise from entering the receiving circuit of the high frequency IC. In addition, the transmission signal outputted from the high frequency IC passes through the vicinity of the duplexer to be inputted to the power amplifier IC. However, because the transmission signal has not been amplified yet, the transmission signal has only a small influence on the duplexer or other circuits. Since the power amplifier IC and the duplexer are disposed adjacent to each other, the length of the signal wire for transmitting the amplified transmission signal can be reduced. That is, the signal wire for transmitting the signal amplified by the power amplifier IC to the duplexer can be shorter than the signal wire for transmitting the signal before amplification outputted from the high frequency IC. Accordingly, power loss and noise may be minimized. In addition, the duplexer may be mounted on or embedded in the circuit substrate.

In a preferred example of the present invention, a ground electrode is formed on a bottom surface of the circuit substrate, the power amplifier IC is embedded in the circuit substrate, and a heat dissipation electrode of the power amplifier IC is connected to the ground electrode on the bottom surface of the circuit substrate through the via conductor. According to the present invention, the distance between the heat-dissipating electrode of the power amplifier IC and the ground electrode disposed at a bottom surface of the circuit substrate may be minimized, thereby improving the heat dissipation efficiency.

A preferred example of the present invention includes a core layer that is a conductive layer having a thickness greater than other conductive layers and that functions as a ground; a ground electrode disposed on a bottom surface, wherein one or both of the high frequency IC and the power amplifier IC is disposed in a penetrating hole or a recess formed in the core layer. According to the present invention, the shielding and heat dissipating properties of high frequency IC and the power amplifier IC are improved due to the core layer.

A high frequency circuit module according to the present invention includes: a circuit substrate having alternately stacked insulating layers and conductive layers; and a power amplifier IC mounted on one surface of the circuit substrate, wherein the circuit substrate includes: a terminal electrode formed on another surface of the circuit substrate, in a region projected in the thickness direction of a region where the power amplifier IC is formed; a first via conductor for heat dissipation that connects the terminal of the power amplifier IC to a conductive layer in the circuit substrate; and a second via conductor for heat dissipation that connects the conductive layer to a ground electrode.

According to the present invention, the heat generated in the power amplifier IC is transmitted by the first via conductor in the thickness direction of the circuit substrate, and is transmitted in the left and right direction along the conductive layer. The heat in the conductive layer is transmitted to the ground electrode of the circuit substrate through the second via conductor, and is dissipated to a mother circuit substrate in which the conductive layer is disposed. As a result, even if the power amplifier IC were disposed in the periphery of the circuit substrate, the heat generated by the power amplifier IC can be dissipated to the mother circuit substrate through the first via conductor and second via conductor for heat dissipation, and through the conductive layer.

Also, a high frequency circuit module of the present invention includes: a circuit substrate having stacked insulating layers and conductive layers; a high frequency IC that is mounted on the circuit substrate and that performs transmission and reception of a high frequency signal; a power amplifier IC that is mounted on the circuit substrate and that amplifies a transmission signal from the high frequency IC; and a duplexer having a transmission filter that performs filtering on the transmission signal outputted from the power amplifier IC to the antenna, and a reception filter that performs filtering on a reception signal inputted from the antenna to the high frequency IC, wherein the transmission filter is disposed closer to the power amplifier IC than the reception filter is.

According to the present invention, it is possible to make the signal line that transmits the transmission signal amplified by the power amplifier IC to the transmission filter of the duplexer short, and thus, it is possible to attain miniaturization and increased density while preventing noise in the reception circuit of the high frequency IC, and to decrease power loss and radiation of noise.

As described above, according to the present invention, the signal wire for inputting the reception signal from a duplexer to the high frequency IC need not be disposed adjacent to the power amplifier IC. In addition, the length of the signal wire for inputting the reception signal from the duplexer to the high frequency IC can be reduced. Such structure facilitates the miniaturization and high density while preventing noise from entering the receiving circuit of the high frequency IC.

It is to be understood that both the foregoing general description and the following detailed description are exemplary and explanatory, and are intended to provide further explanation of the invention as claimed.

DETAILED DESCRIPTION OF THE PREFERRED EMBODIMENTS

Embodiment 1

Figure 1:
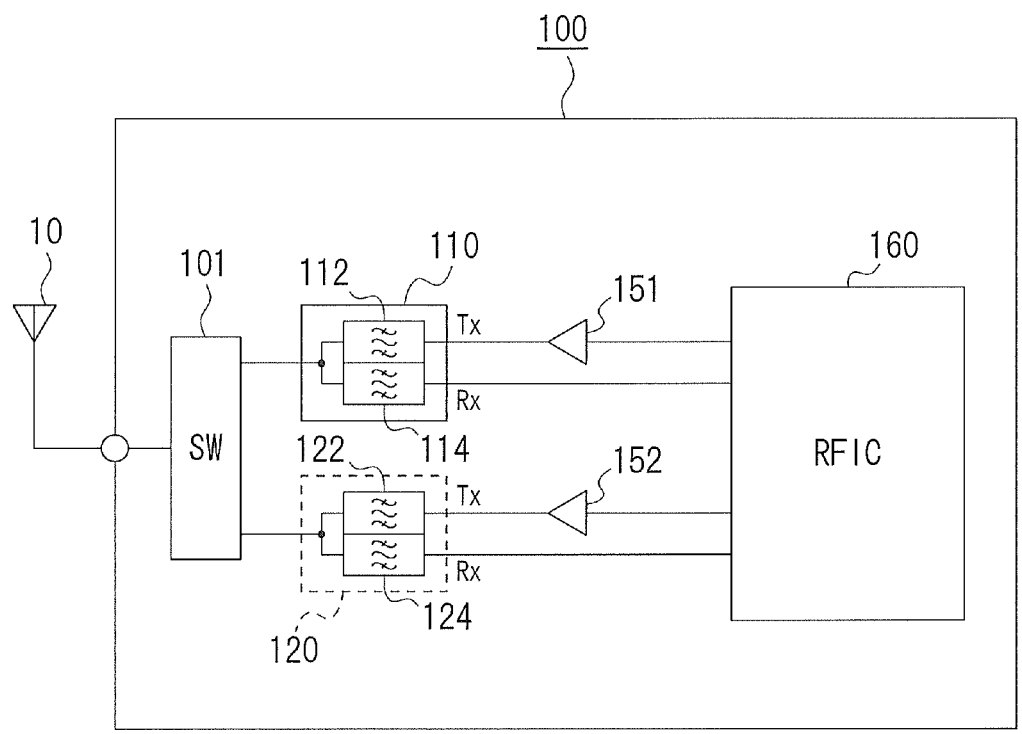
FIG. 1 is a circuit diagram schematically illustrating a high frequency circuit module according to Embodiment 1 of the present invention.

A high frequency circuit module according to Embodiment 1 of the present invention will now be described with reference to accompanying drawings. FIG. 1 is a circuit diagram schematically illustrating a high frequency circuit module. The description of Embodiment 1 will be focused on the main constitution of the present invention for simplification.

A high frequency circuit module 100 according to Embodiment 1 is preferably used in mobile phones employing two frequency bands. As shown in FIG. 1, the high frequency circuit module 100 includes a high frequency switch 101, a first duplexer 110, a second duplexer 120, high frequency transmission power amplifiers 151 and 152 for transmission, and a radio-frequency integrated circuit (RFIC) 160. Although the high frequency circuit module 100 includes a matching circuit, a band pass filter for a transmission signal, and the like for each of frequency bands when implemented as an actual circuit, they are omitted in the present embodiment for simplification.

The high frequency switch 101 switches between a connection between the first duplexer 110 and an external antenna 10 and a connection between the second duplexer 120 and the external antenna 10.

The first duplexer 110 includes a transmission filter 112 and a reception filter 114, and the second duplexer 120 includes a transmission filter 122 and a reception filter 124. Various filters such as a surface acoustic wave (SAW) filter and a bulk acoustic wave (BAW) filter may be used as the transmission filters 112 and 122 and the reception filters 114 and 124. In Embodiment 1, the SAW filter is used. The transmission filters 112 and 122 are connected to a transmission port of the RFIC 160 through the high frequency power amplifiers 151 and 152, respectively. The reception filters 114 and 124 are connected to a receiving port of the RFIC 160. The high frequency power amplifiers 151 and 152 are packaged into a single power amplifier IC 155. The RFIC 160 performs transmission processing and reception processing such as modulation/demodulation or multiplexing on a high frequency signal.

Figure 2:
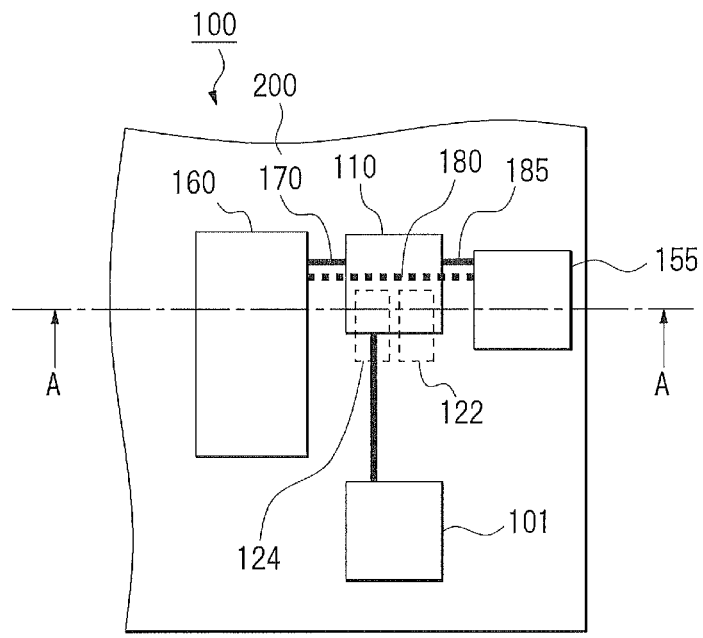
FIG. 2 is a top view of the high frequency circuit module according to Embodiment 1 of the present invention.
Figure 3:
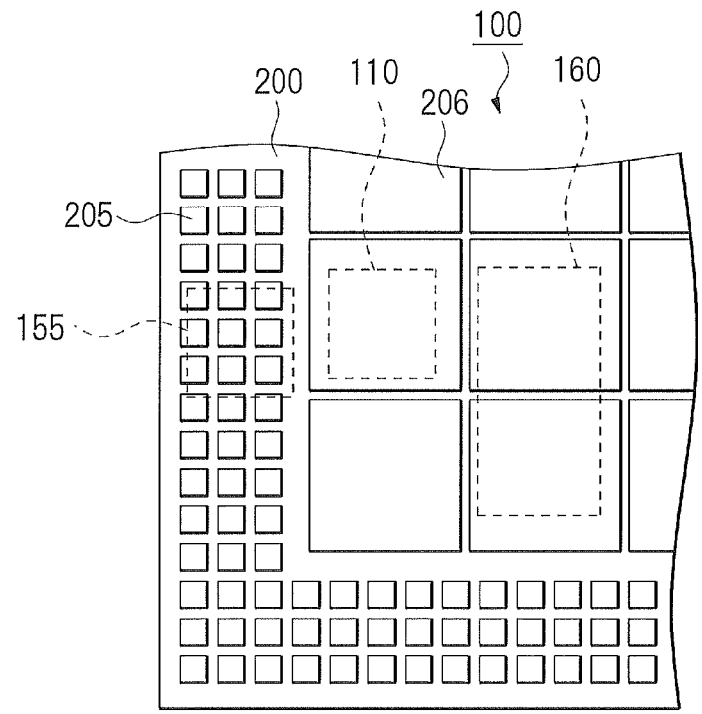
FIG. 3 is a bottom view of the high frequency circuit module according to Embodiment 1 of the present invention.
Figure 4:
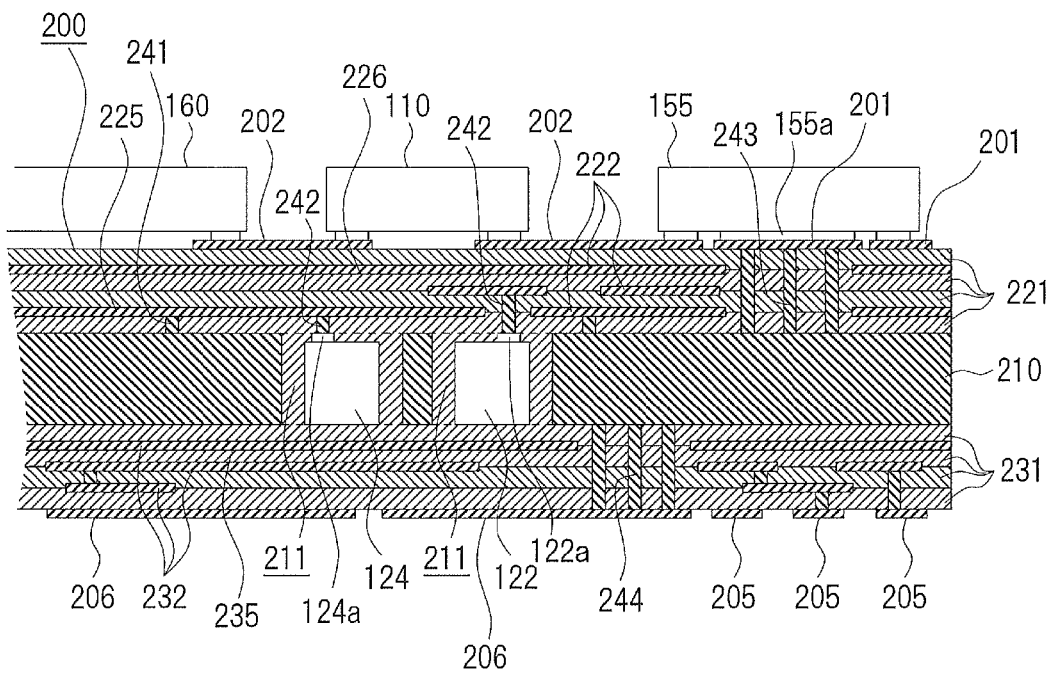
FIG. 4 is a cross-sectional view of the high frequency circuit module according to Embodiment 1 of the present invention.

Next, the structure of the high frequency circuit module 100 will be described with reference to FIGS. 2 to 4. FIG. 2 is a top view of the high frequency circuit module 100. FIG. 3 is a bottom view of the high frequency circuit module 100. FIG. 4 is a cross-sectional view along line A-A of FIG. 2.

As shown in FIG. 2, the RFIC 160, the first duplexer 110, the power amplifier IC 155 and the high frequency switch 101 are mounted on a top surface of a circuit substrate 200 in the high frequency circuit module 100. The first transmission filter 112 and the first reception filter 114 are housed in one surface-mount package to constitute the first duplexer 110. The second duplexer 120 is embedded in the circuit substrate 200. Here, the second duplexer 120 has a structure in which elements thereof (the transmission filter 122, the reception filter 124, etc.) are individually embedded in the circuit substrate 200. That is, the elements of the second duplexer 120 are not housed in a single package contrary to the first duplexer 110.

The circuit substrate 200 is multilayered and includes alternately stacked insulating layers and conductive layers. As shown in FIG. 4, the circuit substrate 200 includes a core layer 210, which is a conductive layer having high conductivity and made of a relatively thick metal, a plurality of insulating layers 221 and a plurality of conductive layers 222 that are disposed on a first main surface, i.e., a top surface, of the core layer 210 and a plurality of insulating layers 231 and a plurality of conductive layers 232 that are disposed on a second main surface, i.e., a bottom surface, of the core layer 210. The insulating layers 221 and 231 and the conductive layers 222 and 232 are disposed on the respective main surfaces of the core layer 210 according to a build-up technique. Here, two layers among the conductive layers 222 disposed between the first main surface (top surface) of the core layer 210 and the first main surface (top surface) of the circuit substrate 200 and one layer among the conductive layers 232 disposed between the second main surface (bottom surface) of the core layer 210 and the second main surface (top surface) of the circuit substrate 200 serve as ground conductive layers 225, 226 and 235 of a reference potential (ground). The ground conductive layers 225 and 235 are the conductive layers 222 and 232 closest to the core layer 210, and connected to the core layer 210 through a via conductor 241. Thus, the core layer 210 may also serve as a ground conductor. In addition, the conductive layer 222 is disposed between the two ground conductive layers 225 and 226 and enables a wire formed in the conductive layer 222 to serve as a strip line. Conductive lands 201 or wires 202 are disposed on the first main surface (top surface) of the circuit substrate 200 for mounting components thereon. In addition, a plurality of terminal electrodes 205 are disposed on an edge portion of the second main surface (bottom surface) of the circuit substrate 200. A plurality of ground electrodes 206 that are larger than the plurality of terminal electrodes 205 in area are disposed on a region of the second main surface (bottom surface) of circuit substrate 200 interior to the region where the plurality of terminal electrodes 205 are disposed. The RFIC 160, the first duplexer 110 and the power amplifier IC 155 are soldered to the plurality of lands 201.

Penetrating holes 211 for housing components are formed in the core layer 210. In the penetrating holes 211, the second transmission filter 122 and the second reception filter 124 of the second duplexer 120 are disposed. Thus, the core layer 210 is preferably thicker than the components embedded therein. In the present embodiment, the core layer 210 is made of a metal plate, and more particularly, a metal plate made of copper or a copper alloy. Spaces between the components housed in the penetrating holes 211 are filled with an insulator such as a resin, such that the insulating layer 221 or 231 is integrally formed with the insulator. Terminal electrodes 122a and 124a are disposed on a top surface of the second transmission filter 122 and a top surface of the second reception filter 124, respectively. The terminal electrodes 122a and 124a are connected to the conductive layers 222 through a via conductor 242.

The high frequency circuit module 100 according to the present invention is characterized in that the first duplexer 110 and the second duplexer 120 (i.e., the second transmission filter 122 and the second reception filter 124) are disposed between the RFIC 160 and the power amplifier IC 155 as shown in FIG. 2. Thus, a length of a signal wire 170 for inputting a reception signal from the first duplexer 110 or the second duplexer 120 to the RFIC 160 can be reduced, and noise can be greatly suppressed from entering the signal wire 170. As shown in FIG. 2, the reception signal received from the first duplexer 110 is inputted to the RFIC 160 through the signal wire 170 disposed on the top surface of the circuit substrate 200. The transmission signal outputted from the RFIC 160 is inputted to the power amplifier IC 155 through a signal wire 180 disposed on an internal layer of the circuit substrate 200, and more particularly, on the conductive layers 222 interposed between the two ground conductive layers 225 and 226. An amplified transmission signal outputted from the power amplifier IC is inputted to the first duplexer 110 through a signal wire 185 disposed on the top surface of the circuit substrate 200. Here, the signal wire 185 for transmitting the signal amplified by the power amplifier IC is shorter than the signal wire 180 for transmitting a signal before amplification outputted from the RFIC 160. In addition, in FIG. 2, signal wires through which signals are inputted to and outputted from the second duplexer 120 are omitted for simplification.

The high frequency circuit module 100 according to the present invention is also characterized in that the power amplifier IC 155 is installed at the edge portion of the circuit substrate 200 as shown in FIGS. 2 and 3. As shown in FIG. 3, when viewed from the top of the circuit substrate 200, the power amplifier IC 155 overlaps a portion of the terminal electrodes 205. In addition, as shown in FIG. 4, a ground terminal 155a of the power amplifier IC 155 is mounted on the lands 201 of the circuit substrate 200, and the lands 201 are connected to the core layer 210 through a plurality of via conductors 243 for heat dissipation. In addition, the core layer 210 is connected to the ground electrodes 206 below the core layer 210 through a plurality of conductors 244 for heat dissipation. In the structure described above, the heat generated from the power amplifier IC 155 is conducted in the vertical direction of the circuit substrate 200 through the via conductors 243 and along the core layer 210 in the horizontal direction. The heat generated from the core layer 210 is conducted to the ground electrodes 206 through the conductors 244, and dissipated to the circuit substrate 200 where the core layer 210 is disposed.

In the high frequency circuit module 100 described above, since the duplexers 110 and 120 are disposed between the RFIC 160 and the power amplifier IC 155, the signal wire for inputting the reception signal from the duplexer 110 or 120 to the RFIC 160 need not be located near the power amplifier IC 155. In addition, the length of the signal wire for inputting the reception signal from the duplexer 110 or 120 to the RFIC 160 can be reduced. Such structure facilitates the miniaturization and high density while preventing noise from entering the receiving circuit of the RFIC 160. In addition, the transmission signal outputted from the RFIC 160 passes through the vicinity of the duplexers 110 and 120 to be inputted to the power amplifier IC 155. However, the transmission signal has only a small influence on the duplexers 110 and 120 or other circuits because the transmission signal is not yet amplified. Moreover, since the power amplifier IC 155 and the duplexers 110 and 120 are disposed adjacent to each other, the length of the signal wire transmitting the amplified transmission signal can be reduced. Accordingly, power loss and noise are minimized.

In addition, in the high frequency circuit module 100 according to the present embodiment, the heat generated from the power amplifier IC can be dissipated to the circuit substrate 200 through the via conductors 243 and 244 and the core layer 210 even when the power amplifier IC 155 is disposed on the edge portion of the circuit substrate 200. Thus, the RFIC 160 can be disposed in the region interior to the edge portion of the circuit substrate 200. Accordingly, the arrangement of components or the design of circuit pattern, particularly at the vicinity of the RFIC 160, is facilitated and the length of the signal wires can be reduced, thereby improving the high frequency characteristics of the high frequency circuit module 100.

Figure 5:
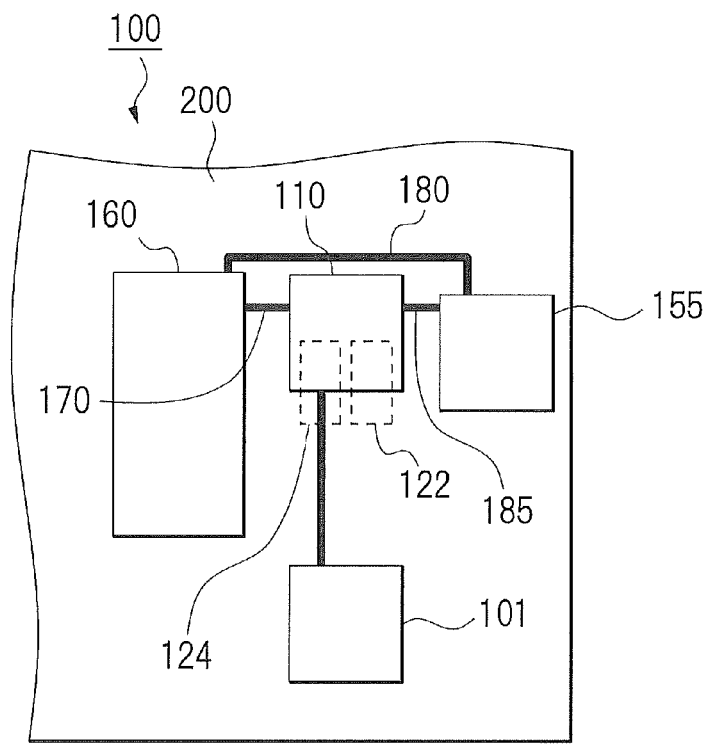
FIG. 5 is a top view of a high frequency circuit module according to another example of Embodiment 1 of the present invention.

While the transmission signal transmitted from the RFIC 160 is inputted to the power amplifier IC 155 through the signal wire 180 disposed on the internal layer of the circuit substrate 200 in accordance with Embodiment 1, the transmission signal may be inputted to the power amplifier IC 155 through the signal wire 181 disposed on the circuit substrate 200 as shown in FIG. 5.

Embodiment 2

A high frequency circuit module according to Embodiment 2 of the present invention will now be described with reference to the accompanying drawings. The high frequency circuit module according to Embodiment 2 differs from the high frequency circuit module according to Embodiment 1 in the installation structures of the RFIC and the power amplifier IC. Other aspects such as the schematic circuit diagram of the high frequency circuit module, for example, are similar to that of Embodiment 1, and thus, mainly the difference between the embodiments will be described here.

Figure 6:
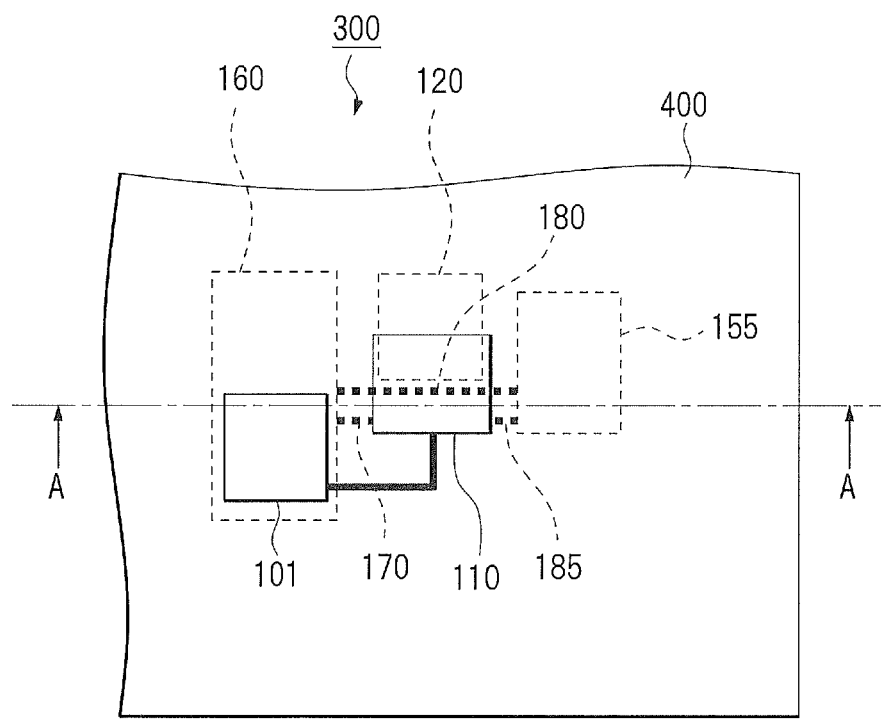
FIG. 6 is a top view of a high frequency circuit module according to Embodiment 2 of the present invention.
Figure 7:
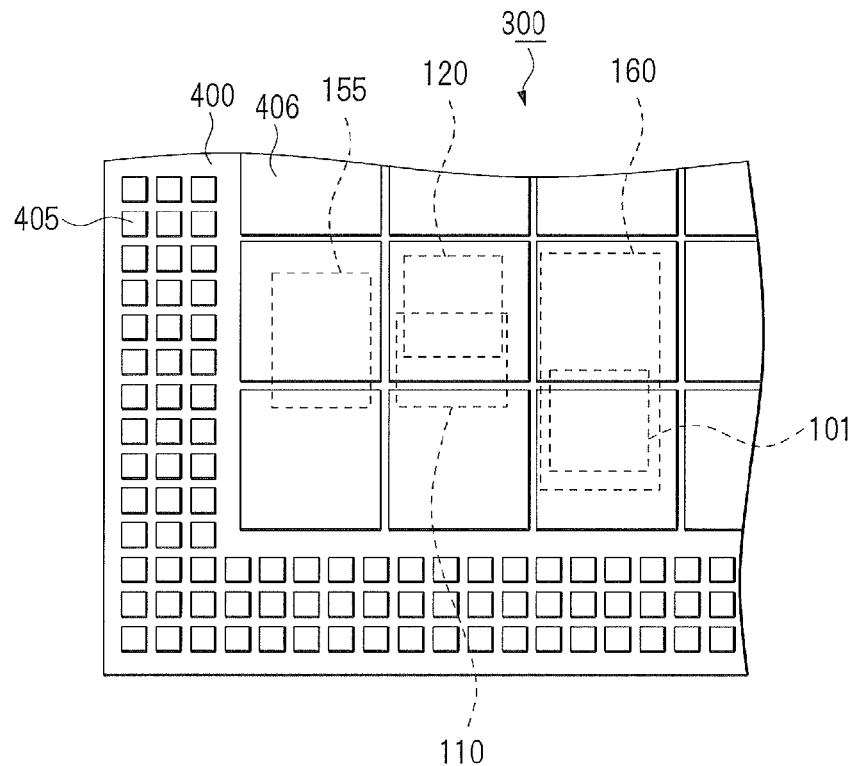
FIG. 7 is a bottom view of the high frequency circuit module according to Embodiment 2 of the present invention.
Figure 8:
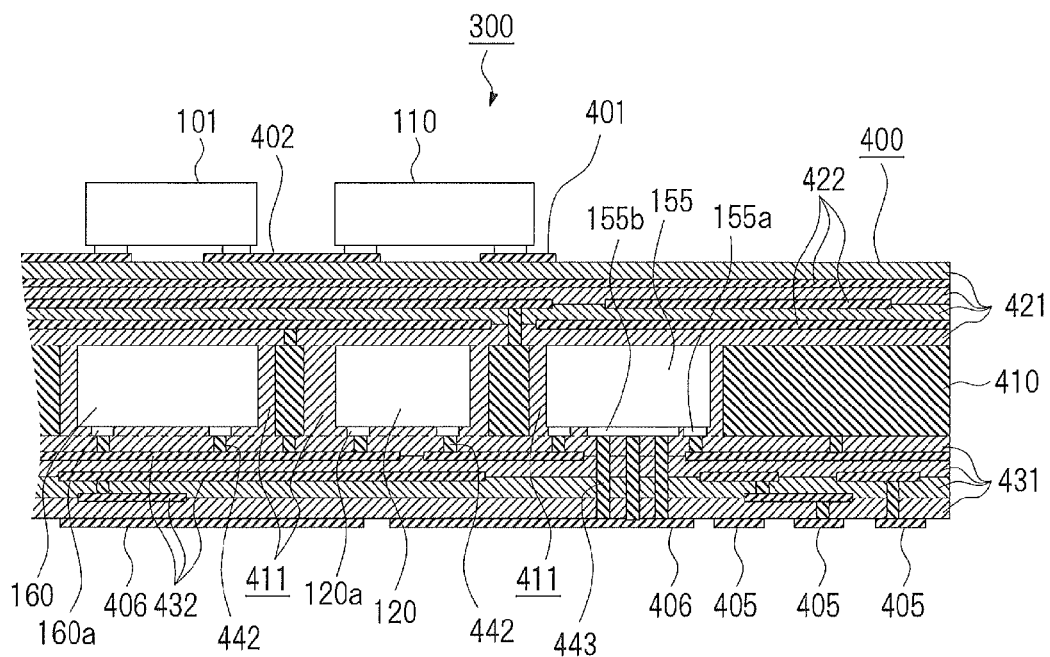
FIG. 8 is a cross-sectional view of the high frequency circuit module according to Embodiment 2 of the present invention.

The structure of a high frequency circuit module 300 according to Embodiment 2 will now be described with reference to FIGS. 6 to 8. FIG. 6 is a top view of the high frequency circuit module 300. FIG. 7 is a bottom view of the high frequency circuit module 300. FIG. 8 is a cross-sectional view along the line A-A of FIG. 6.

As shown in FIG. 6, in the high frequency circuit module 300 includes a high frequency switch 101 and a first duplexer 110 mounted on a top surface of a circuit substrate 400. The first duplexer 110 is an individual component in which a first transmission filter 112 and a first reception filter 114 are housed in a single package. A second duplexer 120, an RFIC 160 and a power amplifier IC 155 are embedded in the circuit substrate 400. The second duplexer 120 is an individual component in which a second transmission filter 122 and a second reception filter 124 are housed in a single embedded package.

The circuit substrate 400 is a multilayered substrate including alternately stacked insulating layers and conductive layers. As shown in FIG. 8, the circuit substrate 400 includes a core layer 410, which is a conductive layer having high conductivity and made of a relatively thick metal, a plurality of insulating layers 421 and a plurality of conductive layers 422 disposed on a first main surface (top surface) of the core layer 410, and a plurality of insulating layers 431 and a plurality of conductive layers 432 disposed on a second main surface (bottom surface) of the core layer 410. The insulating layers 421 and 431 and the conductive layers 422 and 432 are disposed on the respective main surfaces of the core layer 410 according to the build-up technique. Here, the core layer 410 serves as a ground conductor of a reference potential (ground). Conductive lands 401 or wires 402 are disposed on the first main surface (top surface) of the circuit substrate 400 for mounting components thereon. In addition, a plurality of terminal electrodes 405 are disposed on an edge portion of the second main surface (bottom surface) of the circuit substrate 400. A plurality of ground electrodes 406 that are larger than the plurality of terminal electrodes 405 in area are disposed on a region of the second main surface (bottom surface) of circuit substrate 400 interior to the region where the plurality of terminal electrodes 405 are disposed. The high frequency switch 101 and the first duplexer 110 are soldered to the plurality of lands 401.

Penetrating holes 411 for housing components are formed in the core layer 410. In the penetrating holes 411, the RFIC 160, the second duplexer 120, and the power amplifier IC 155 are disposed. Thus, the thickness of the core layer 410 is preferably greater than the heights of the electronic components embedded therein and has a higher refractive index than the electronic components. In addition, the core layer 410 is made of a conductive material and is electrically grounded. Thus, the core layer 410 may be regarded as a conductive layer of the multilayered circuit substrate 400 in a broader sense. In Embodiment 2, the core layer 410 is made from a metal plate, and more particularly, a metal plate formed of copper or a copper alloy. Spaces between the components housed in the penetrating holes 411 are filled with an insulator such as a resin, such that the insulating layers 421 or 431 are integrally formed with the insulator. Terminal electrodes 160a, 120a and 155a are disposed on bottom surfaces of the RFIC 160, the second duplexer 120, and the power amplifier IC 155, respectively. The terminal electrodes 160a, 120a, and 155a are connected to the conductive layers 432 through a via conductor 442.

Similar to the high frequency circuit module 100 according to Embodiment 1, the high frequency circuit module 300 is characterized in that the first duplexer 110 and the second duplexer 120 are disposed between the RFIC 160 and the power amplifier IC 155 as shown in FIGS. 6 and 7. Thus, the length of a signal wire 170 for inputting a reception signal from the first duplexer 110 or the second duplexer 120 to the RFIC 160 can be reduced, and noise can be greatly suppressed from being mixed through the signal wire 170. As shown in FIG. 6 the reception signal outputted from the first duplexer 110 is inputted to the RFIC 160 through the signal wire 170 disposed on an internal layer of the circuit substrate 400. The transmission signal outputted from the RFIC 160 is inputted to the power amplifier IC 155 through a signal wire 180 disposed on the internal layer of the circuit substrate 400. The transmission signal amplified by the power amplifier IC 155 is inputted to the first duplexer 110 through a signal wire 185 disposed on the internal layer of the circuit substrate 400. The signal wire 185 for transmitting the signal amplified by the power amplifier IC 155 is shorter than the signal wire 180 for transmitting the signal before amplification outputted from the RFIC 160. In FIG. 6, the signal wires through which signals are inputted to and outputted from the second duplexer 120 are omitted for simplification.

In addition, as shown in FIGS. 6 and 7, when viewed from the top of the circuit substrate 400, at least a portion of the RFIC 160 overlaps the high frequency switch 101 in accordance with Embodiment 2. Further, a portion of the first duplexer 110 overlaps the second duplexer 120. As described above, since components are arranged to overlap with each other, the density of components increases, thereby reducing the size of a high frequency circuit module. In addition, such structure enables the reduction in the length of various signal wires that connect the high frequency switch 101, the duplexers 110 and 120, the power amplifier IC 155 and the RFIC 160. Thus, signal loss, noise penetration or the like can be suppressed.

As shown in FIG. 7, when viewed from the top of the circuit substrate 400, the power amplifier IC 155 overlaps a portion of the ground electrodes 406. In addition, as shown in FIG. 8, a ground terminal 155b that also serves as a heat-dissipating electrode of the power amplifier IC 155 is connected to the ground electrodes 406 disposed on the bottom surface of the circuit substrate 400 through a plurality of heat-dissipating via conductors 443. The structure described above enables the conduction of the heat generated from the power amplifier IC 155 to the ground electrodes 406 through the via conductors 443 and to the circuit substrate 400 including the power amplifier IC 155.

In the high frequency circuit module 300 described above, since the duplexers 110 and 120 are disposed between the RFIC 160 and the power amplifier IC 155, the signal wire for inputting the reception signal from the duplexer 110 or 120 to the RFIC 160 need not be disposed near the power amplifier IC 155. In addition, the length of the signal wire for inputting the reception signal from the duplexer 110 or 120 to the RFIC 160 can be reduced. Such structure facilitates the miniaturization and high density while preventing noise from entering the receiving circuit of the RFIC 160. In addition, the transmission signal outputted from the RFIC 160 passes through the vicinity of the duplexers 110 and 120 to be inputted to the power amplifier IC 155. However, the transmission signal has only a small influence on the duplexers 110 and 120, other circuits, or the like because the transmission signal is not yet amplified. Moreover, since the power amplifier IC 155 and the duplexers 110 and 120 are disposed adjacent to one another, the length of the signal wire transmitting the amplified transmission signal can be reduced. Accordingly, power loss and noise are minimized.

In addition, in the high frequency circuit module 300 according to Embodiment 2, the power amplifier IC 155 is embedded in the circuit substrate 400, and the distance between the heat-dissipating electrode 155b of the power amplifier IC 155 and the ground electrodes 406 of the circuit substrate 400 can be reduced. Thus, the heat dissipation efficiency of the power amplifier IC 155 is improved.

The present invention is not limited to the embodiments of the present invention described above. For example, while both of the RFIC 160 and the power amplifier IC 155 are mounted on the circuit substrate 200 in accordance with Embodiment 1, and both of the RFIC 160 and the power amplifier IC 155 are embedded in the circuit substrate 400 in accordance with Embodiment 2, the RFIC 160 may be mounted on the circuit substrate and the power amplifier IC 155 may be embedded in the circuit substrate the circuit substrate. Alternatively, the RFIC 160 may be embedded in the circuit substrate and the power amplifier IC 155 may be mounted on the circuit substrate. In addition, in the respective embodiments, the duplexers 110 and 120 or the high frequency switch 101 may be either mounted on or embedded in the circuit substrate.

In addition, the structures of the signal wires installed among the RFIC 160, the power amplifier IC 155, and the duplexers 110 and 120 in accordance with the embodiments above are merely examples of the present invention. Thus, the signal wires may be disposed on or in the circuit substrate according to the specifications of the high frequency circuit module.

Moreover, the installation structures of the duplexers 110 and 120 are not limited to the embodiments in which the second duplexer 120 is embedded in the circuit substrate 200 such that the filters 122 and 124 thereof, which are individual components, are also embedded in the circuit substrate 200 in accordance with Embodiment 1, and the second duplexer 120 is embedded in the circuit substrate 400 such that the filters 122 and 124 thereof, which are individual components, are packaged in accordance with Embodiment 2.

While one power amplifier IC 155 in which the two high frequency power amplifiers 151 and 152 are embedded in accordance with the embodiments above, the number of amplifier circuits embedded in the power amplifier IC 155 or the number of the power amplifier ICs 155 is not limited. In another example of mounting the circuit shown in FIG. 1, two power amplifier ICs corresponding to two high frequency power amplifiers 151 and 152 may be installed on the circuit substrate 200. In this case, the two power amplifier ICs may be mounted on or embedded in the circuit substrate 200. Moreover, one of the two power amplifier ICs may be mounted on the circuit substrate 200 and the other power of the two amplifier ICs may be embedded in the circuit substrate 200.

In the embodiments above, the penetrating holes 211 and 411 are disposed in the respective core layers 210 and 410 and components such as filters, RFICs, and power amplifier ICs are disposed in the penetrating holes 211 and 411. However, recessed portions may be formed in the core layers 210 and 410 instead of the penetrating holes 211 and 411, and the components may be disposed in the recessed portions.

In addition, while the core layers 210 and 410 made of copper or a copper alloy are exemplified in the embodiments above, the materials of the core layers 210 and 410 are not limited to copper and a copper alloy. For example, the core layers 210 and 410 may be made of other metals or alloys, resin, etc. In addition, the core layers 210 and 410 may or may not be conductive. Further, while the circuit substrates 200 and 400 include the core layers 210 and 410 that are relatively thick in accordance with the embodiments above, the circuit substrates 200 and 400 may be multilayered without the core layers 210 and 410.

Furthermore, various components are mounted so as to be exposed on the top surfaces of the circuit substrates 200 and 400 in accordance with the embodiments above, but the circuit substrates 200 and 400 may be housed in a case or sealed with resin, so as to entirely or partially cover the top surfaces of the circuit substrates 200 and 400.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:
1. A high frequency circuit module, comprising:
 a circuit substrate having stacked insulating layers and conductive layers;

a high frequency IC that is mounted on the circuit substrate and that performs transmission and reception of a high frequency signal;

a power amplifier IC that is mounted on the circuit substrate and that amplifies a transmission signal from the high frequency IC; and a duplexer having a transmission filter that performs filtering on an amplified transmission signal outputted from the power amplifier IC to an antenna, and a reception filter that performs filtering on a reception signal inputted from the antenna to the high frequency IC, wherein the transmission filter is disposed closer to the power amplifier IC than the reception filter is, wherein the circuit substrate includes: a core layer that is a conductive layer having a thickness greater than other conductive layers and that functions as a ground; a ground electrode disposed on a bottom surface of the circuit substrate; a first via conductor for heat dissipation that connects a lower surface of the power amplifier IC to the core layer; and a second via conductor for heat dissipation that connects the ground electrode to the core layer, wherein the duplexer is disposed in a penetrating hole or a recess formed in the core layer of the circuit substrate.

2. A The high frequency circuit module, comprising:

a circuit substrate having stacked insulating layers and conductive layers;

a high frequency IC that is mounted on the circuit substrate and that performs transmission and reception of a high frequency signal;

a power amplifier IC that is mounted on the circuit substrate and that amplifies a transmission signal from the high frequency IC; and a duplexer having a transmission filter that performs filtering on an amplified transmission signal outputted from the power amplifier IC to an antenna, and a reception filter that performs filtering on a reception signal inputted from the antenna to the high frequency IC, wherein the transmission filter is disposed closer to the power amplifier IC than the reception filter is, wherein the circuit substrate includes: a core layer that is a conductive layer having a thickness greater than other conductive layers and that functions as a ground; a ground electrode disposed on a bottom surface of the circuit substrate; a first via conductor for heat dissipation that connects a lower surface of the power amplifier IC to the core layer; and a second via conductor for heat dissipation that connects the ground electrode to the core layer, wherein the transmission filter and the reception filter are individually disposed within respective penetrating holes or recesses formed in the core layer.

* * * * *